(12) United States Patent
Krivokapic

(10) Patent No.: US 6,888,198 B1
(45) Date of Patent: May 3, 2005

(54) STRADDLED GATE FDSOI DEVICE

(75) Inventor: Zoran Krivokapic, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 333 days.

(21) Appl. No.: 09/873,674

(22) Filed: Jun. 4, 2001

(51) Int. Cl.[7] .................... H01L 27/01; H01L 27/12; H01L 31/0392; H01L 31/113; H01L 31/119

(52) U.S. Cl. .................. 257/347; 257/348; 257/349; 257/350; 257/387; 257/412

(58) Field of Search ................ 257/347–354, 257/387, 412, 366, 365, 507

(56) References Cited

U.S. PATENT DOCUMENTS

| | | | |
|---|---|---|---|
| 4,745,079 A | 5/1988 | Pfiester ................ 437/29 |
| 4,755,478 A | 7/1988 | Abernathey et al. ........ 437/41 |
| 5,006,913 A | * 4/1991 | Sugahara et al. .......... 257/67 |
| 5,061,647 A | 10/1991 | Roth et al. .............. 437/40 |
| 5,164,805 A | * 11/1992 | Lee ..................... 257/351 |
| 5,210,435 A | 5/1993 | Roth et al. ............. 257/344 |
| 5,283,455 A | * 2/1994 | Inoue et al. ............ 257/329 |
| 5,371,391 A | * 12/1994 | Sato .................... 257/387 |
| 5,567,966 A | * 10/1996 | Hwang .................. 257/347 |
| 5,593,909 A | 1/1997 | Han et al. .............. 437/41 |
| 5,600,168 A | * 2/1997 | Lee ..................... 257/336 |
| 5,621,236 A | * 4/1997 | Choi et al. ............. 257/389 |
| 5,625,217 A | * 4/1997 | Chau et al. ............. 257/412 |
| 5,693,549 A | * 12/1997 | Kim .................... 437/41 |
| 5,717,237 A | 2/1998 | Chi ..................... 257/315 |
| 5,756,365 A | 5/1998 | Kakumu ................ 437/40 SW |
| 5,770,490 A | 6/1998 | Frenette et al. ........... 438/199 |
| 5,834,797 A | * 11/1998 | Yamanaka ............... 257/57 |
| 5,894,157 A | 4/1999 | Han et al. ............. 257/407 |
| 5,960,270 A | 9/1999 | Misra et al. ............ 438/197 |
| 5,962,895 A | * 10/1999 | Beyer et al. ............ 257/347 |

(Continued)

FOREIGN PATENT DOCUMENTS

| | | | |
|---|---|---|---|
| DE | 0631707 A2 | * 3/1993 | .............. 257/347 |
| EP | 1 033 752 A2 | 9/2000 | |
| JP | 411317459 A | 11/1999 | |
| WO | 97/03462 | 1/1997 | |

*Primary Examiner*—Tom Thomas
*Assistant Examiner*—Jesse A. Fenty
(74) *Attorney, Agent, or Firm*—Renner, Otto, Boisselle & Sklar, LLP

(57) ABSTRACT

A straddled gate device, and a method of producing such device, formed on a semiconductor-on-insulator (SOI) substrate having active regions defined by isolation regions and an insulator layer. The device includes a first gate defining a first channel region interposed between a source and a drain formed within the active region of the SOI substrate. Additionally, the device includes a second gate straddling the first gate defining second channel regions interposed between the first channel region and the source and the drain. Further still, the device includes a contact connecting the first gate with the second gate wherein when the device is in the off state ($I_{off}$) the first channel region and second channel regions define a long channel and when the device is in the on state ($I_{on}$) the first channel region defines a short channel.

15 Claims, 17 Drawing Sheets

U.S. PATENT DOCUMENTS

| | | | | |
|---|---|---|---|---|
| 5,977,591 A | | 11/1999 | Fratin et al. | 257/344 |
| 6,043,545 A | * | 3/2000 | Tseng et al. | 257/408 |
| 6,049,114 A | * | 4/2000 | Maiti et al. | 257/412 |
| 6,087,208 A | | 7/2000 | Krivokapic et al. | 438/183 |
| 6,097,070 A | * | 8/2000 | Mandelman et al. | 257/389 |
| 6,107,667 A | | 8/2000 | An et al. | 257/408 |
| 6,204,137 B1 | | 3/2001 | Teo et al. | 438/305 |
| 6,210,999 B1 | | 4/2001 | Gardner et al. | 438/183 |
| 6,218,276 B1 | * | 4/2001 | Liu et al. | 438/596 |
| 6,225,669 B1 | | 5/2001 | Long et al. | 257/401 |
| 6,281,559 B1 | | 8/2001 | Yu et al. | 257/407 |
| 6,297,106 B1 | | 10/2001 | Pan et al. | 438/287 |
| 6,300,177 B1 | | 10/2001 | Sundaresan et al. | 438/197 |
| 6,300,657 B1 | * | 10/2001 | Bryant et al. | 257/318 |
| 6,344,675 B1 | * | 2/2002 | Imai | 257/347 |
| 6,348,387 B1 | * | 2/2002 | Yu | 438/303 |
| 6,373,668 B2 | * | 4/2002 | Yamaguchi | 361/56 |
| 6,380,589 B1 | * | 4/2002 | Krivokapic | 257/347 |
| 6,424,009 B1 | * | 7/2002 | Ju | 257/347 |
| 6,441,433 B1 | * | 8/2002 | En et al. | 257/344 |
| 6,486,080 B2 | * | 11/2002 | Chooi et al. | 438/785 |
| 6,509,612 B2 | * | 1/2003 | Clevenger et al. | 257/339 |
| 6,632,714 B2 | * | 10/2003 | Yoshikawa | 438/258 |
| 6,660,588 B1 | * | 12/2003 | Yang et al. | 438/257 |
| 6,734,510 B2 | * | 5/2004 | Forbes et al. | 257/407 |
| 6,812,514 B1 | * | 11/2004 | Yang et al. | 257/314 |

* cited by examiner

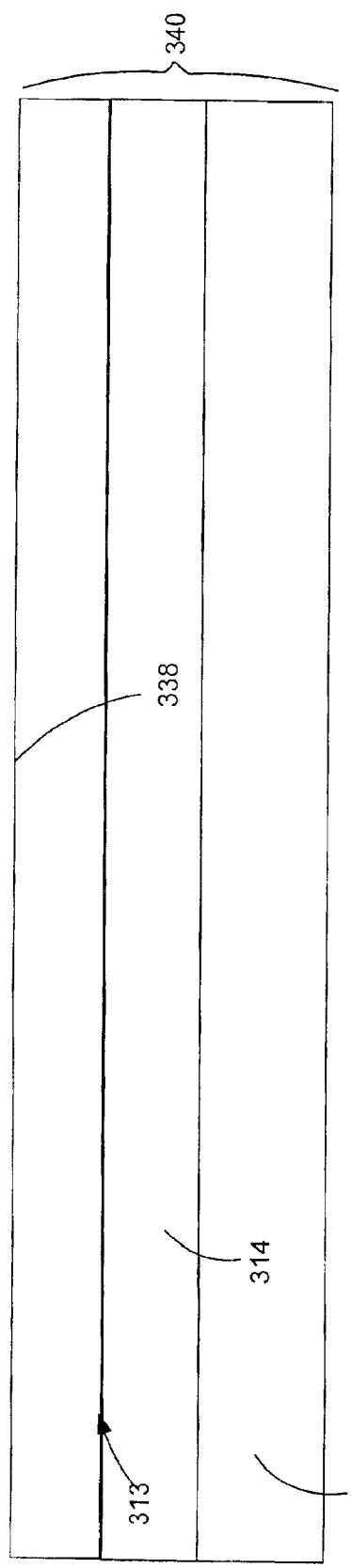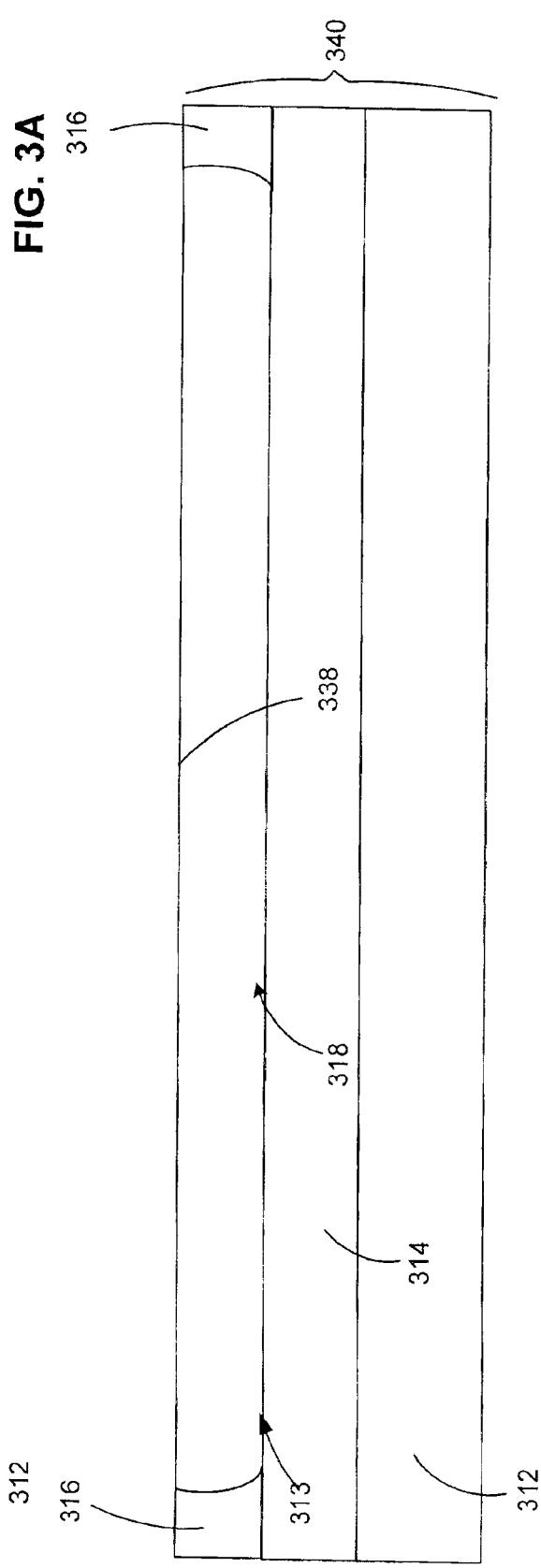

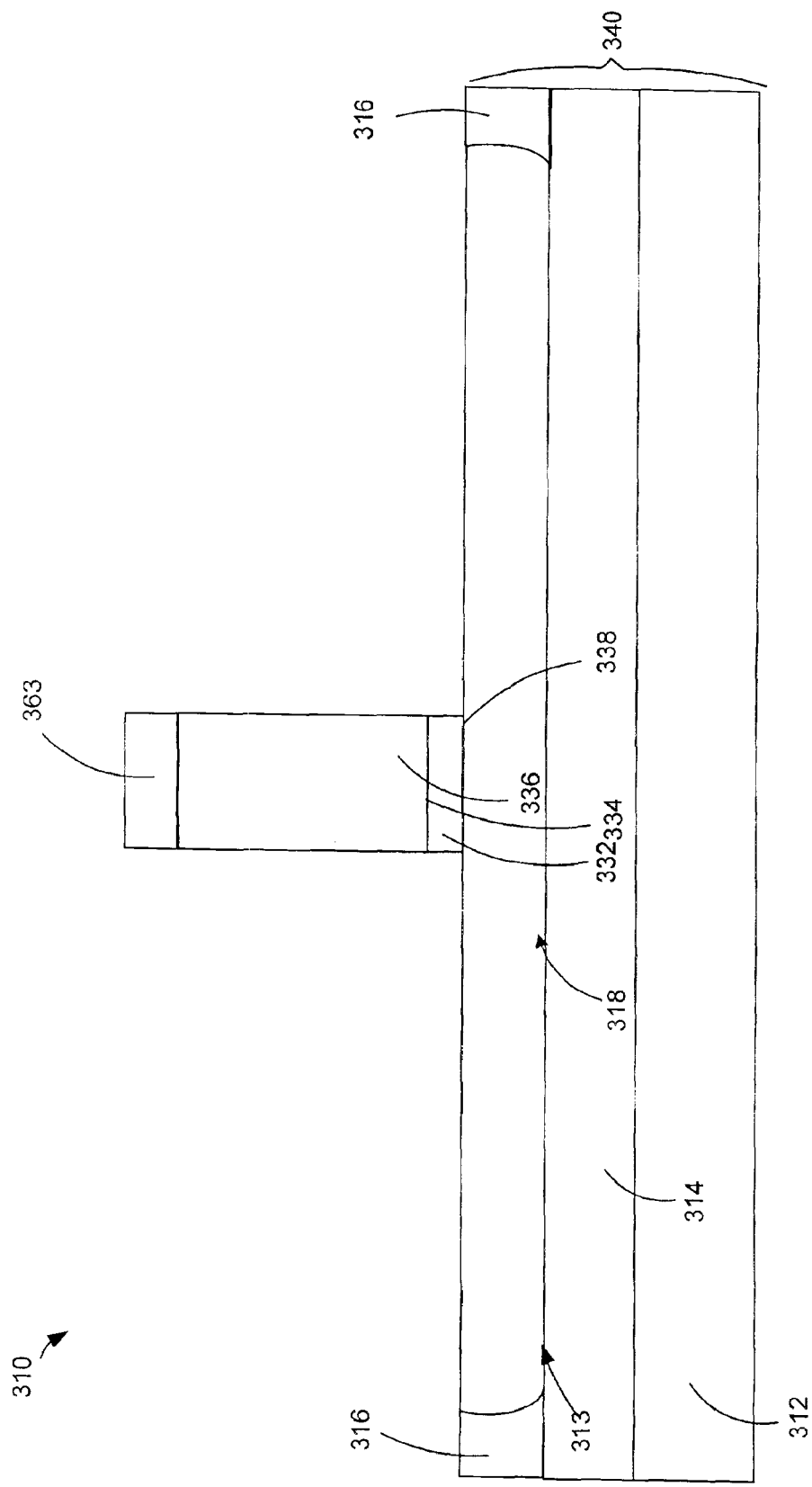

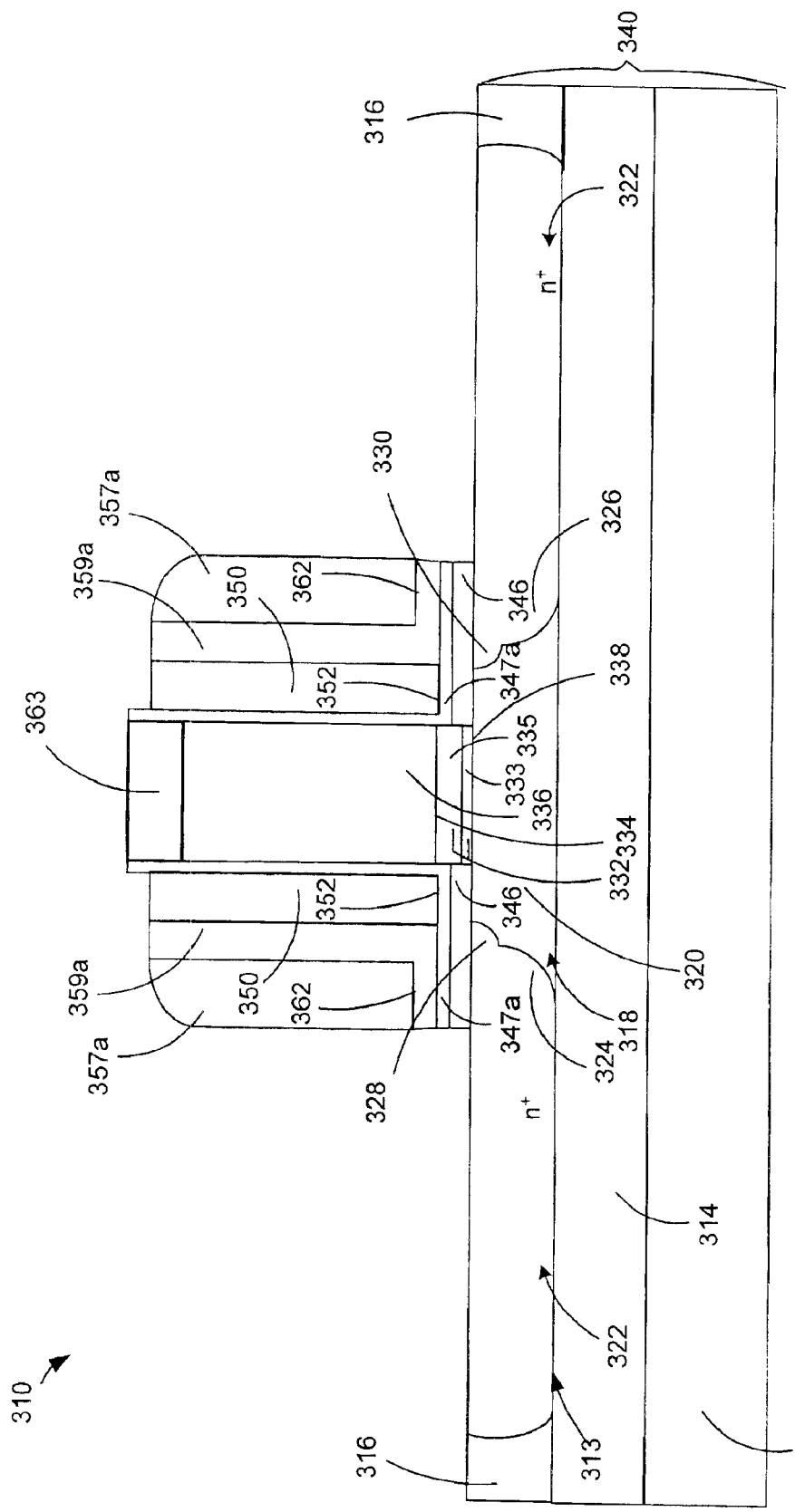

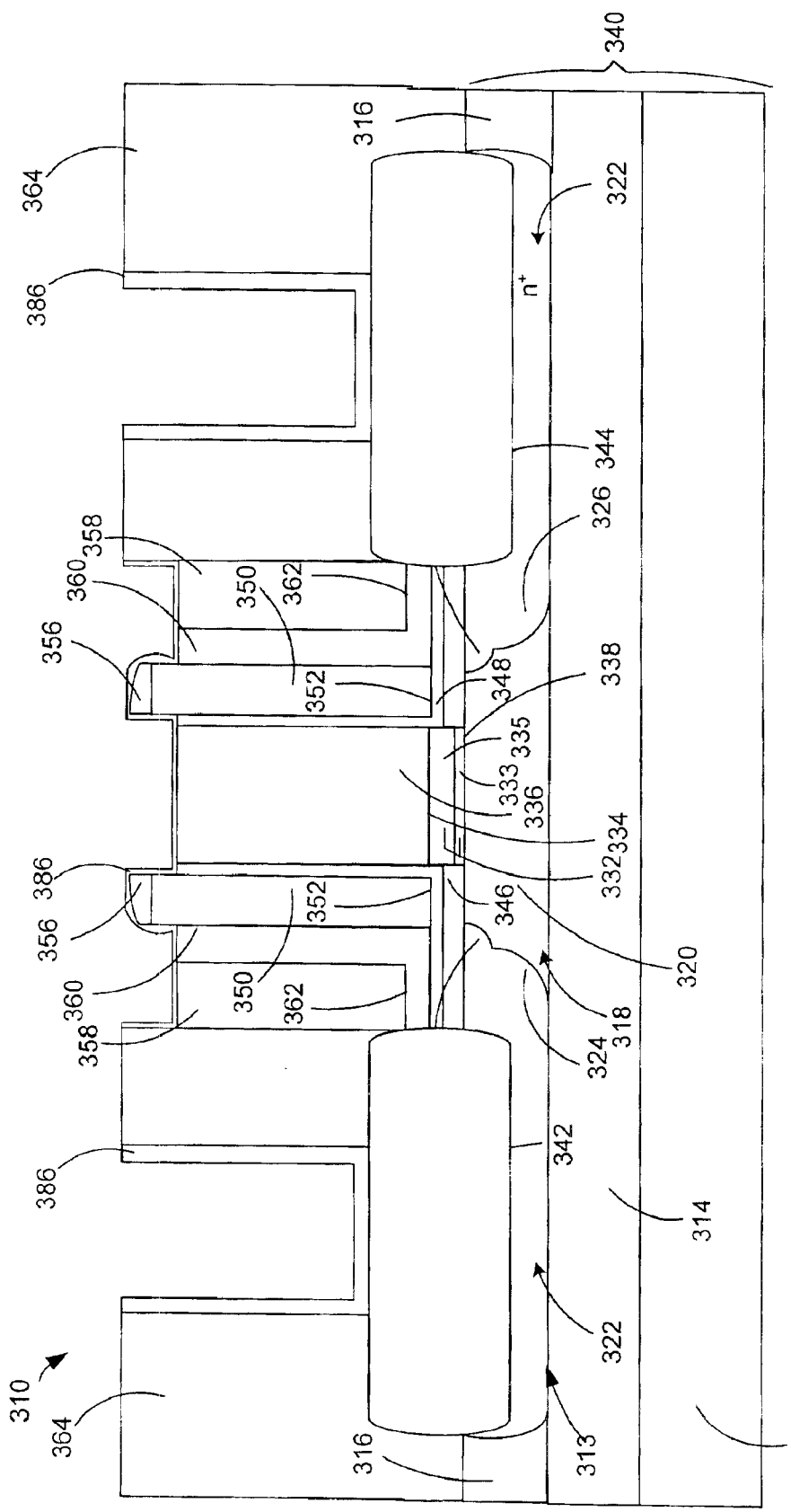

STRADDLED GATE FDSOI DEVICE

TECHNICAL FIELD

The present invention generally relates to the manufacture of semiconductor devices on semiconductor-on-insulator (SOI) structures and, more specifically, relates to the manufacture of fully depleted SOI (FDSOI) devices including a straddled gate for improving an off state ($I_{off}$) while maintaining a high on state ($I_{on}$).

BACKGROUND ART

Traditional silicon-on-insulator (SOI) and fully depleted SOI (FDSOI) transistor devices typically have a gate defining a channel interposed between a source and a drain formed within an active region of an SOI or FDSOI substrate. Such SOI or FDSOI devices have several advantages over devices formed on conventional bulk substrates: the elimination of latch-up, improved radiation hardness, dynamic coupling, lower parasitic junction capacitance, and simplified device isolation and fabrication. Such advantages allow semiconductor device manufacturers to produce low-voltage, low-power, high-speed devices thereon. For example, metal-oxide semiconductor field effect transistors (MOSFETs) are commonly formed on FDSOI structures. However, MOSFETs formed on such FDSOI structures suffer from a short-channel effect.

The short-channel effect refers to the effect caused by reducing a "long" channel to a "short" channel. A channel length is "long" where a depletion layer formed under the channel has a depth equal to its length. When a channel length is shortened to an extreme, the depletion layer extending from the drain side spreads in the direction of the source region and contacts with the depletion layer of the source side.

As a result, a potential barrier in the vicinity of the source is lowered by the drain voltage and a current ($I_{off}$) flows by itself even when no voltage is applied to the gate electrode. In this case, an energy band between the source and the drain changes continuously. This is the punch-through effect which lowers the withstand voltage between the source and the drain.

While various countermeasures have been taken to reduce the short-channel effect described above, a general measure, which has been taken most frequently, is channel-doping. Channel-doping is a technique for suppressing the short-channel effect by doping a trace amount of an impurity element such as P (phosphorus) or B (boron) shallowly in the channel region (as disclosed in Japanese Patent Laid Open Nos. Hei. 4-206971, 4-286339 and others).

However, the channel-doping technique has a drawback in that it significantly restricts the field effect mobility (hereinafter referred to simply as a mobility) of the MOSFET. That is, the movement of carriers is hampered by the intentionally doped impurity, thus dropping the mobility.

Therefore, there exists a need in the art for a device formed on a fully depleted semiconductor-on-insulator structure with increased performance and better characteristics enhanced by improving an off state ($I_{off}$) while maintaining a high on state ($I_{on}$).

SUMMARY OF THE INVENTION

According to one aspect of the invention, the invention is a straddled gate device formed on a semiconductor-on-insulator (SOI) substrate having active regions defined by isolation regions and an insulator layer. The device includes a first gate defining a first channel region interposed between a source and a drain formed within the active region of the SOI substrate. Additionally, the device includes a second gate straddling the first gate defining second channel regions interposed between the first channel region and the source and the drain. Further still, the device includes a contact connecting the first gate with the second gate wherein when the device is in the off state ($I_{off}$) the first channel region and second channel regions define a long channel and when the device is in the on state ($I_{on}$) the first channel region defines a short channel. In one embodiment, the device includes a silicide layer formed on the main source and drain regions.

According to another aspect of the invention, the invention is a straddled gate device formed on a germanium-on-insulator (GOI) substrate.

According to another aspect of the invention, the invention is a method of fabricating a straddled gate device formed on a semiconductor-on-insulator (SOI) substrate having active regions defined by isolation regions and an insulator layer. The method includes the steps of forming a first gate defining a first channel region interposed between a source and a drain formed within the active region of the SOI substrate. Additionally, the method includes the step of forming a second gate straddling the first gate defining second channel regions interposed between the first channel region and the source and the drain. Further still, the method includes forming a contact connecting the first gate with the second gate wherein when the device is in the off state ($I_{off}$) the first channel region and second channel regions define a long channel and when the device is in the on state ($I_{on}$) the first channel region defines a short channel. In one embodiment, the method includes forming a silicide layer on the main source and drain regions.

BRIEF DESCRIPTION OF DRAWINGS

These and further features of the present invention will be apparent with reference to the following description and drawings, wherein.

DISCLOSURE OF INVENTION

Figure 1:
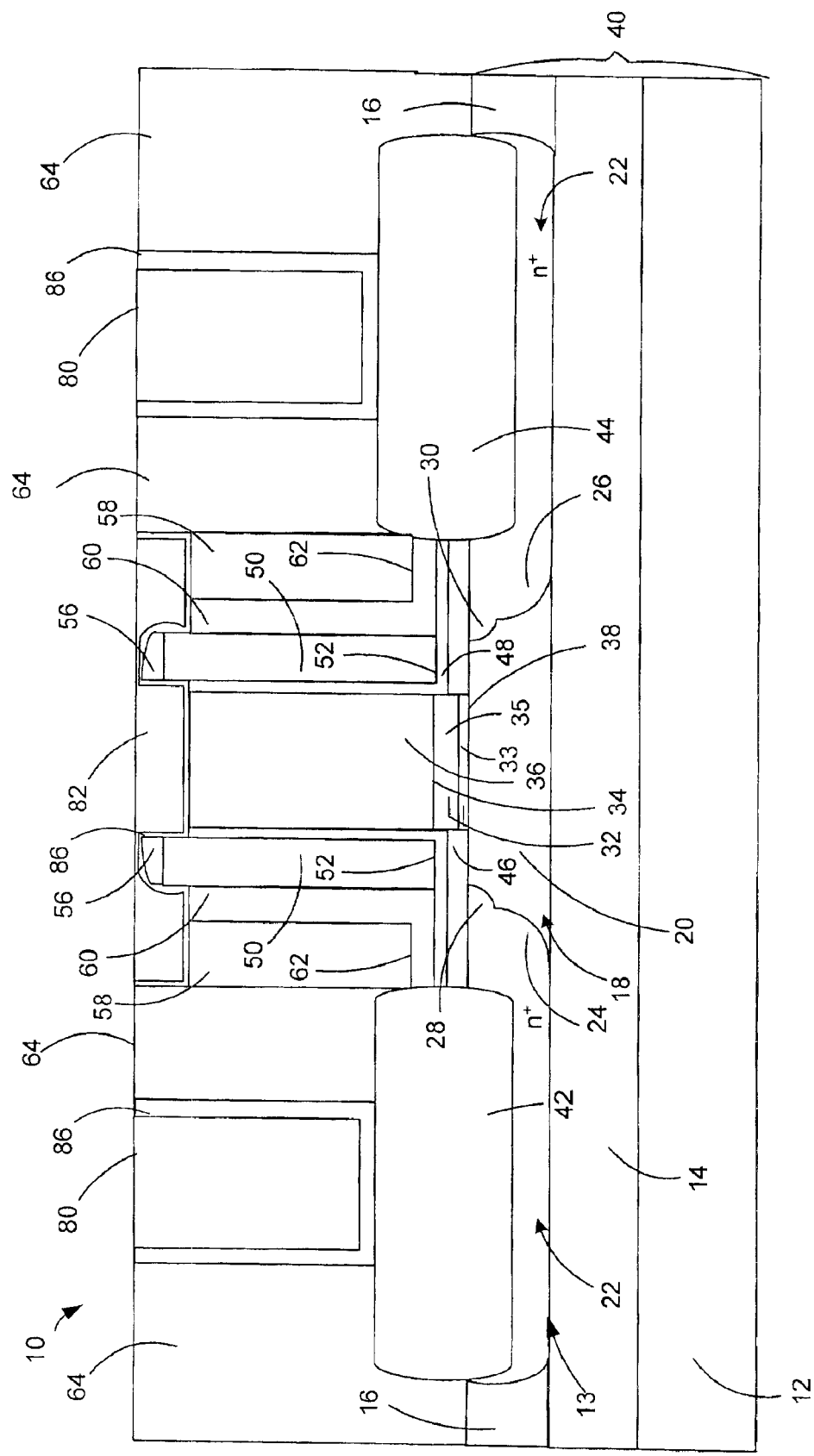
FIG. 1 is a cross-section of a straddle gate FDSOI device including silicide layers according to the present invention.

In the detailed description that follows, identical components have been given the same reference numerals. To illustrate the present invention in a clear and concise manner, the drawings may not necessarily be to scale and certain features may be shown in a partial schematic format.

A straddle gate FDSOI device including silicide layers will now be described in accordance with the present invention. The device includes a first gate and a second gate (straddle gate) straddling the first gate defining a channel interposed between a source and a drain disposed within an active region of a FDSOI structure. The active region is defined by isolation regions and an insulator layer. Further, the device includes a silicide layer formed on the main source and drain regions and silicide caps formed on the polysilicon spacers of the straddle gate as will be described in more detail below. Further still, the device may include contact plugs in electrical contact with the first gate and the straddle gate, and with at least one of the source and the drain.

A work function of the first gate and a work function of the straddle gate are uniquely defined. The work function of the straddle gate is less than the first gate. Thus, the straddle gate FDSOI device acts like a long channel in the off state (low $I_{off}$) and as a short channel in the on state (high $I_{on}$).

Therefore, the straddle gate FDSOI device results in a device with improved $I_{off}$ while maintaining a high $I_{on}$.

Referring initially to FIG. 1, a straddle gate FDSOI device of the present invention is shown generally designated as 10. The straddle gate FDSOI device 10 is formed within a fully depleted semiconductor-on-insulator (FDSOI) structure having a semiconductor substrate 12, an insulator layer 14 formed on the semiconductor substrate 12, and a semiconductor layer 13 disposed on the insulator layer 14. Within the semiconductor layer 13, isolation regions 16 as well as the insulator layer 14 define semiconductor active regions 18 of which one is shown in FIG. 1.

In an exemplary embodiment, as illustrated in FIG. 1, the active region 18 has an undoped region, or channel 20, and two N+ (source and drain) regions 22. The channel 20 is interposed between the source and drain regions 22. The source and drain regions 22 include respective deep implant regions 24 and 26, as well as respective extension regions 28 and 30. A gate dielectric 32 is interposed between a lower surface 34 of a gate electrode 36 and an upper surface 38 of the FDSOI semiconductor structure 40. The gate dielectric 32 illustrated in FIG. 1 is a multi-layer dielectric, however the gate dielectric could be a single-layer dielectric. The gate dielectric 32 includes a lower dielectric layer 33 and an upper dielectric layer 35. The lower dielectric layer 33 may be made of suitable gate dielectric materials, such as silicon dioxide ($SiO_2$), silicon nitride ($Si_3N_4$), aluminum oxide ($Al_2O_3$), silicon oxynitride (SiON), or the like. The upper dielectric layer 35 may be made of high permittivity (high k) gate dielectric materials, where a high-k value is generally greater than 3.9, such as hafnium oxide ($HfO_2$), zirconium oxide ($ZrO_2$), tantalum oxide ($Ta_2O_5$), or the like. In this embodiment, dielectric layer 33 is made of $SiO_2$ and dielectric layer 35 is made of $HfO_2$. An exemplary dielectric layer 33 of $SiO_2$ may have a thickness of between 5 and 6 Å. An exemplary dielectric layer 35 of $HfO_2$ may have a thickness of between 20 and 30 Å. The gate electrode 36 may be made of typical, well-known gate electrode materials, for example tungsten. An exemplary gate electrode 36 may have a thickness of between 500 and 700 Å.

Silicide layers 42, 44 are disposed on a portion of the source and drain regions 22. Silicide layers 42, 44 are formed over the respective deep implant regions 24 and 26. The silicide layers 42, 44 may be made of typical, well-known silicides, such as cobalt silicide ($CoSi_2$), titanium silicide ($TiSi_2$), tantalum silicide ($TaSi_2$), nickel silicide ($NiSi_2$) or the like. In an exemplary embodiment, the silicide layers 42, 44 are of $CoSi_2$. Silicide layers 42, 44 could have a thickness of between 200 Å and 400 Å.

On top of the semiconductor layer 13 and surrounding the silicide layers 42, 44 is an oxide layer 46. The oxide layer 46 may be made of the oxide materials described above within the gate dielectric materials. The oxide layer 46 may be made of the same oxide material as the thin dielectric layer 33 or may be made of another oxide material described above. An exemplary oxide layer 46 may have a thickness of between 10 and 12 Å. The oxide layer 46 in this embodiment is made of silicon dioxide ($SiO_2$). It will be understood that the use of the term oxide with regard to the oxide layers or portions thereof, encompasses the variety of suitable well-known materials for protecting the underlying surface material, e.g. the gate electrode.

A nitride layer 48 is formed on the oxide layer 46 as well as the sidewalls of the gate electrode 36. The nitride layer 48 may be made of silicon nitride ($Si_3N_4$), silicon oxynitride (SiON), or the like. An exemplary nitride layer 48 may have a thickness of about 10 Å. The nitride layer 48 in this embodiment is made of silicon nitride $Si_3N_4$.

Spacers 50 extend upward from the upper surface 52 of the nitride layer 48 and cover the sidewalls of the nitride layer 48 formed on the sidewalls of gate electrode 36. The spacers 50 extend substantially above the top of the gate electrode 36. Exemplary spacers 50 may have a height of between 800 Å and 1000 Å and a width between 250 Å and 350 Å. The spacers 50 may be made of polysilicon, or the like.

Silicide caps 56 are disposed on top surfaces of the spacers 50. Silicide caps 56 may be made of typical, well-known silicides, as described above. In an exemplary embodiment, the silicide caps 56 are of $CoSi_2$. Silicide caps 56 could have a thickness of between 100 Å and 400 Å.

Interposed between spacers 58 and a portion of the nitride layer 48 and spacers 50 are liner oxide layers 60. The liner oxide layers 60 also surrounds the silicide layers 42, 44. The liner oxide layers 60 also cover a portion of the sidewalls of the spacers 50. Spacers 58 extend upward from the upper surface 62 of the liner oxide layers 60 and cover the sidewalls of the liner oxide layers 60 formed on the portion of the sidewalls of the spacers 50. The spacers 58 extend substantially to the top of the sidewalls of the liner oxide layers 60. Exemplary spacers 58 may have a width of between 400 Å and 600 Å. The spacers 58 may be made of nitride, or the like.

As illustrated in FIG. 1, an isolation layer 64 is formed over the above described structure. The isolation layer may be made of tetraethylorthosilicate (TEOS), or the like. Exemplary TEOS layer 64 may have a thicknesses between 800 and 1000 Å.

Within TEOS layer 64, contact plugs 80, 82 are formed. Contact plugs 80 are formed in the TEOS layer 64 over the source and drain regions 22. As is known in the art, the contact plugs 80 establish an electrical connection to the source and drain regions 22. Instead of the contact plug shown, metal layers (not shown) could be formed in the TEOS layer 64 to establish electrical connection to the source and drain regions 22. $V_{sense}$, $V_{bit}$, $V_{word}$, or other electrical connections may be established to the contact plugs 80, gate electrode 36 and the polysilicon spacers 50, respectively. As shown in FIG. 1, a contact plug 82 is formed in the TEOS layer 64 over the gate electrode 36, the polysilicon spacers 50, the liner oxide layers 60 and the spacers 58, respectively. The contact plugs 80, 82 can also be used along with any contacts and metal layers to establish electrical connection between other nodes (such as an I/O pad or Vss), source or drain of the device.

A variety of materials can be used for the contact plugs 80, 82 including single metal layers as well as metal alloy layers containing two or more metals. One such appropriate metal is tungsten. Tungsten has a high melting temperature, which allows it to endure high-temperature manufacturing processes such as annealing, for example, as described below.

It will be appreciated that other suitable metals may alternatively or in addition be used for the contact plugs 80, 82. For example, layers of different types of metals may be used, if desired. Alternatively, alloys or other combinations of suitable metals may be employed. Alternative examples of other materials include aluminum, nickel, palladium, platinum, tantalum, titanium, aluminum alloys, titanium alloys, tungsten alloys, titanium-tungsten alloys, nickel alloys, palladium alloys, platinum alloys, tantalum alloys, metal silicides, and any other alloys thereof. The advantageous property of high electrical conductivity of a metal contact plugs 80, 82 makes for lower resistance connections between the gate electrodes 36, 50 and other electrical components of the straddled gate FDSOI device 10. However, it will be appreciated that suitable non-metallic semiconductor materials, such as silicon, may alternatively be employed in the contact plugs 80, 82 if desired.

Interposed between the contact plugs 80, 82 and the aforedescribed structure are diffusion barriers 86. The diffusion barriers 86 may be made of, for example, titanium nitride (TiN) or the like. Exemplary diffusion barriers 86 may have thicknesses between 50 and 150 Å.

It will be appreciated that the active region 18, the channel 20, the source and drain regions 22, the gate dielectric 32, the gate electrode 36, spacers 50 with the silicide caps 56, the silicide layers 42, 44, and the contacts 80, 82 together form the straddle gate FDSOI device of the present invention. The principles of operation of a straddle gate FDSOI having silicide layers over the source and the drain regions of the gate device will be further explained below. It will be appreciated that the straddle gate FDSOI device 10 may alternatively have other shapes than the shape shown in FIG. 1.

Figure 2:
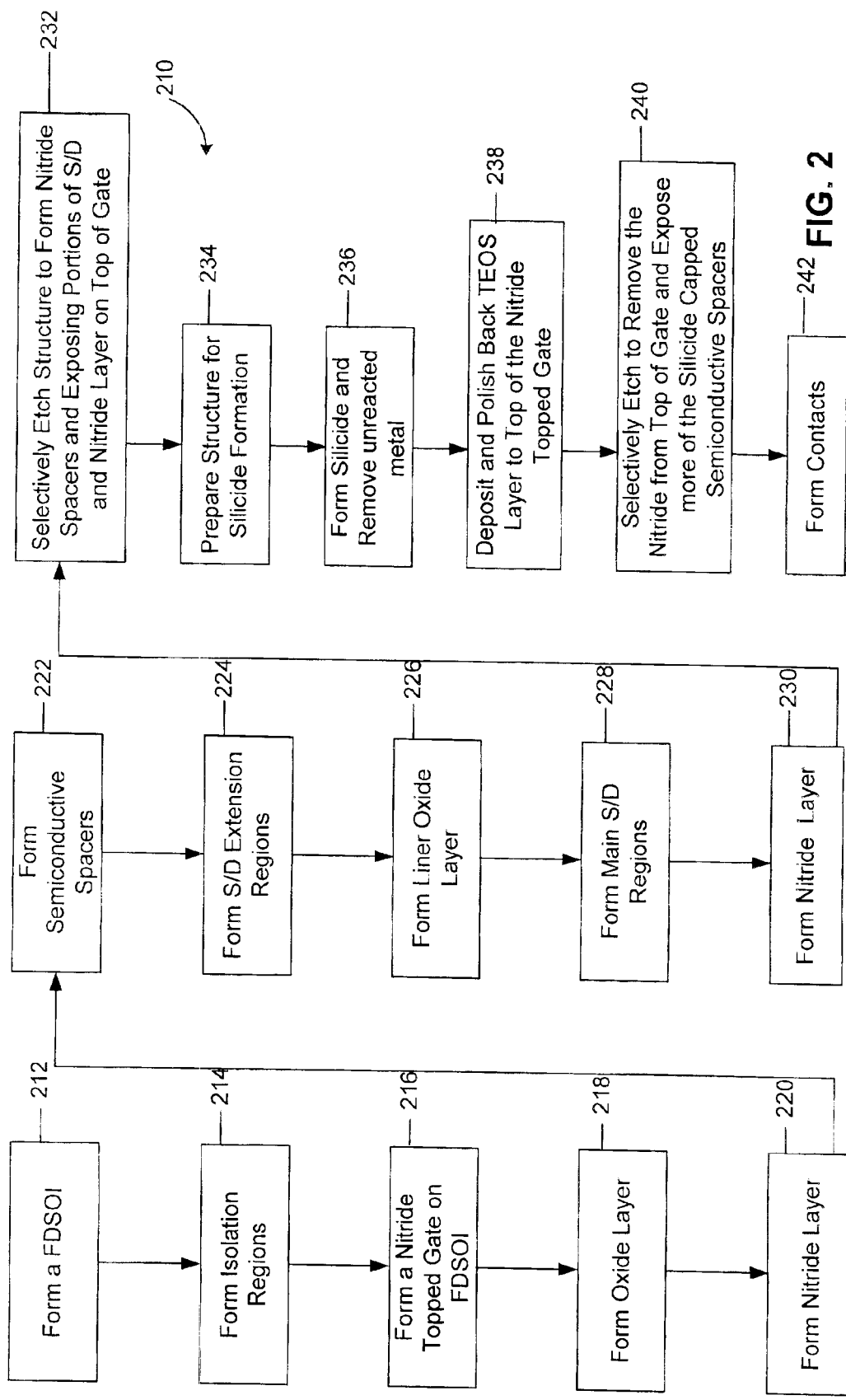
FIG. 2 is a flow diagram of a method of manufacturing the straddle gate FDSOI device including silicide layers according to the present invention.

The steps of a method 210 for fabricating a semiconductor device 310 (which may be similar to the semiconductor device 10 described above) are outlined in the flow chart shown in FIG. 2. FIGS. 3A–3C illustrate various steps of the method 210. It will be appreciated that the method 210 and the semiconductor device 310 described below are merely exemplary, and that suitable embodiments of the many above-described variations in materials, thicknesses, and/or structures may alternatively be used in the method 210 and/or the semiconductor device 310.

In step 212, a FDSOI structure 340 is formed as represented in FIG. 3A. A wafer bonding technique described below may form the FDSOI structure 340. An insulator layer 314 is formed on a first semiconductor substrate 312 (handler substrate). The handler substrate may be of silicon, germanium, or other similar semiconductive material. For the exemplary embodiment a silicon substrate is used. The insulator layer can be any oxide such as silicon dioxide ($SiO_2$), aluminum oxide ($Al_2O_3$), silicon oxynitride (SiON), or the like or any other material with insulator properties such as undoped polysilicon or the like. A chemical or thermal process may be used to form the oxide layer. In one embodiment, a silicon dioxide is thermally grown on the handler substrate 312. Next, a second wafer (not shown), e.g. of silicon, germanium, or other similar semiconductive material, has an insulator layer, e.g. an oxide, such as silicon dioxide chemically vapor deposited (CVD) thereon. The oxide layer may also be thermally grown as described above. Then, one of the substrates, e.g. the second wafer, is flipped over such that the oxide layers are in contact. The second wafer with the oxide layer is then wafer bonded to the handler substrate 312 with the oxide layer at the $SiO_2$ interface. Well-known techniques such as, Bonded and Etchback (BESOI) or the Smart-Cut may be used to reduce the second wafer to a thin semiconductive layer 313. A thermal fusing process may be used at this time to more securely fuse the FDSOI structure. If a semiconductive substrate of germanium is used a silicon oxide or the like is used due to germanium oxide being unstable. Thus, the resulting FDSOI structure 340 includes the semiconductor substrate 312 (handler substrate), an insulator layer 314 formed on the semiconductor substrate 312 and a semiconductor layer 313 disposed on the insulator layer 314 as described above. An exemplary insulator layer 314 may have a thickness of between 1000 Å and 3000 Å. Whereas, an exemplary semiconductor layer 313 disposed on the insulator layer 314 may have a thickness of between 800 Å and 2000 Å. It should be understood that other techniques may be used to form the FDSOI structure 340.

In step 214, within the semiconductor layer 313 disposed on the insulator layer 314 isolation regions 316 are formed which define the placement of a semiconductor active region 318 as represented in FIG. 3B. The regions 316 are insulator-filled to electrically isolate individual electrical devices such as the straddle gate FDSOI device 310. A local oxidized silicon (LOCOS) process that is known in the art may be used. Another process is shallow trench isolation (STI). The first step in forming STI regions is to form trenches in the FDSOI structure 340. Next, the semiconductive layer 313 is oxidized to round off the corners. Then, the oxide is removed during a water rinse. This is followed by a deposition of TEOS, which is polished back to the top surface 338 of the semiconductive layer 313 to form the STI regions 316. The polishing is done using conventional techniques, which are well-known in the art. It will be appreciated that the insulator-filled isolation trenches 316 may be formed in a later step in the method, rather than being formed as part of the intermediate device shown in FIG. 3B. Other isolation techniques that are known in the art e.g. poly buffered LOCOS (PBL), polysilicon encapsulated local oxidation (PELOX) or the like may be used to isolate the straddle gate FDSOI device 310.

In step 216, a nitride topped gate is formed on the FDSOI structure as an intermediate stage of manufacture for the straddle gate FDSOI device 310. As shown in FIG. 3C, the intermediate gate device includes a gate dielectric 332 interposed between the lower surface 334 of a gate electrode 336 and an upper surface 338 of a portion of the FDSOI semiconductor structure 340. On top of gate electrode 336 a nitride layer 363 is formed to protect the gate electrode 36 during further processing. The gate dielectric 332 illustrated in FIG. 3C is a single-layer dielectric, however the gate dielectric could be a multi-layer dielectric as described above. The gate dielectric 332 may be made of suitable high-K gate dielectric materials, such as hafnium oxide ($HfO_2$), zirconium oxide ($ZrO_2$), tantulum oxide ($Ta_2O_5$) or the like. In this embodiment, gate dielectric 332 is made of $HfO_2$. The exemplary gate dielectric 332 of $HfO_2$ may have a thickness of between 20 Å and 30 Å. The gate electrode 336 may be made of typical, well-known conductive materials, for example tungsten. An exemplary gate electrode 336 may have a thickness of between 500 Å and 700 Å. The nitride layer 363 may be made of typical, well-known nitrides, for example silicon oxynitride or the like.

Figure 3D:
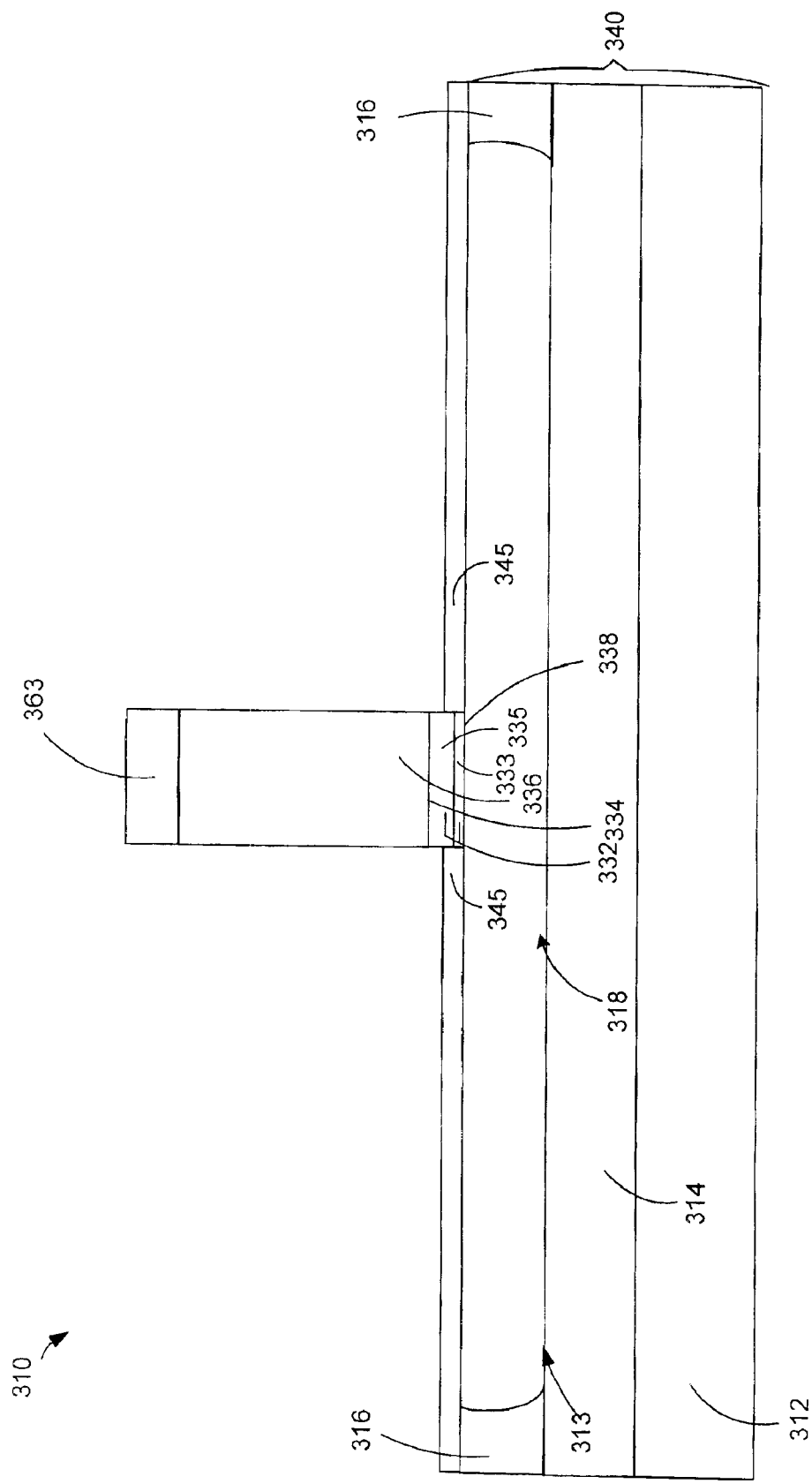
FIGS. 3A–3P are cross-section views of the straddle gate FDSOI device including silicide layers according to the present invention at intermediate stages of manufacture.

Next in step 218, an oxidation process is conducted as represented in FIG. 3D. The oxidation may be performed for between five and sixteen seconds at a temperature of 800° C.–900° C. An oxide layer 345 is formed having a thickness between 10 Å and 12 Å. The oxide layer may form on the gate (not shown). The oxidation process also forms a thin oxide layer 333 under the high-K material gate dielectric layer 335.

Figure 3E:
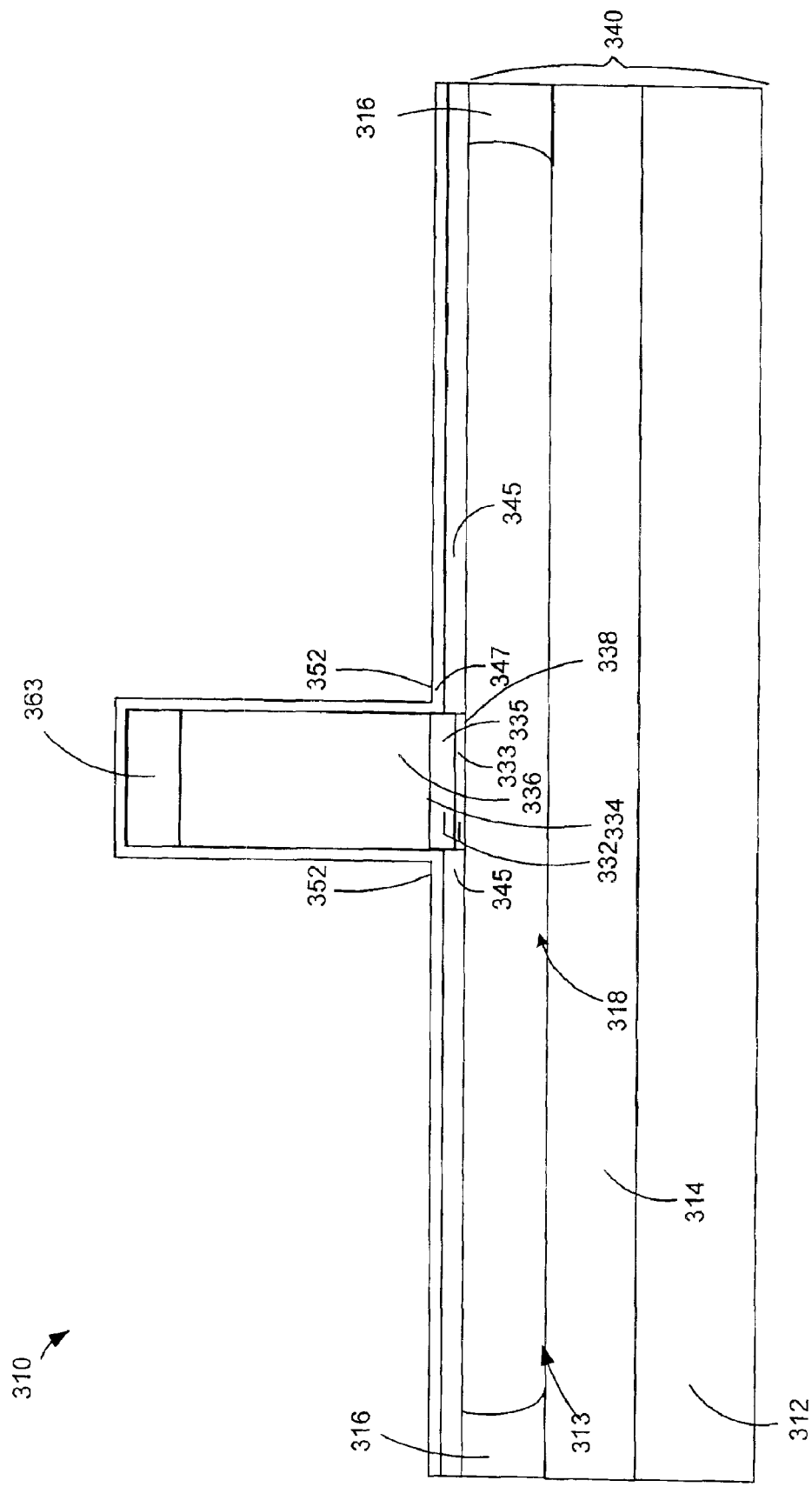

Next in step 220 and as shown in FIG. 3E, a nitride layer 347 is formed overlying the oxide layer 345 and the nitride topped gate. In one embodiment, the nitride layer 347 is a layer of silicon nitride which is deposited using rapid thermal chemical vapor deposition. The nitride layer 347 may have a thickness of about 10 Å.

Figure 3F:
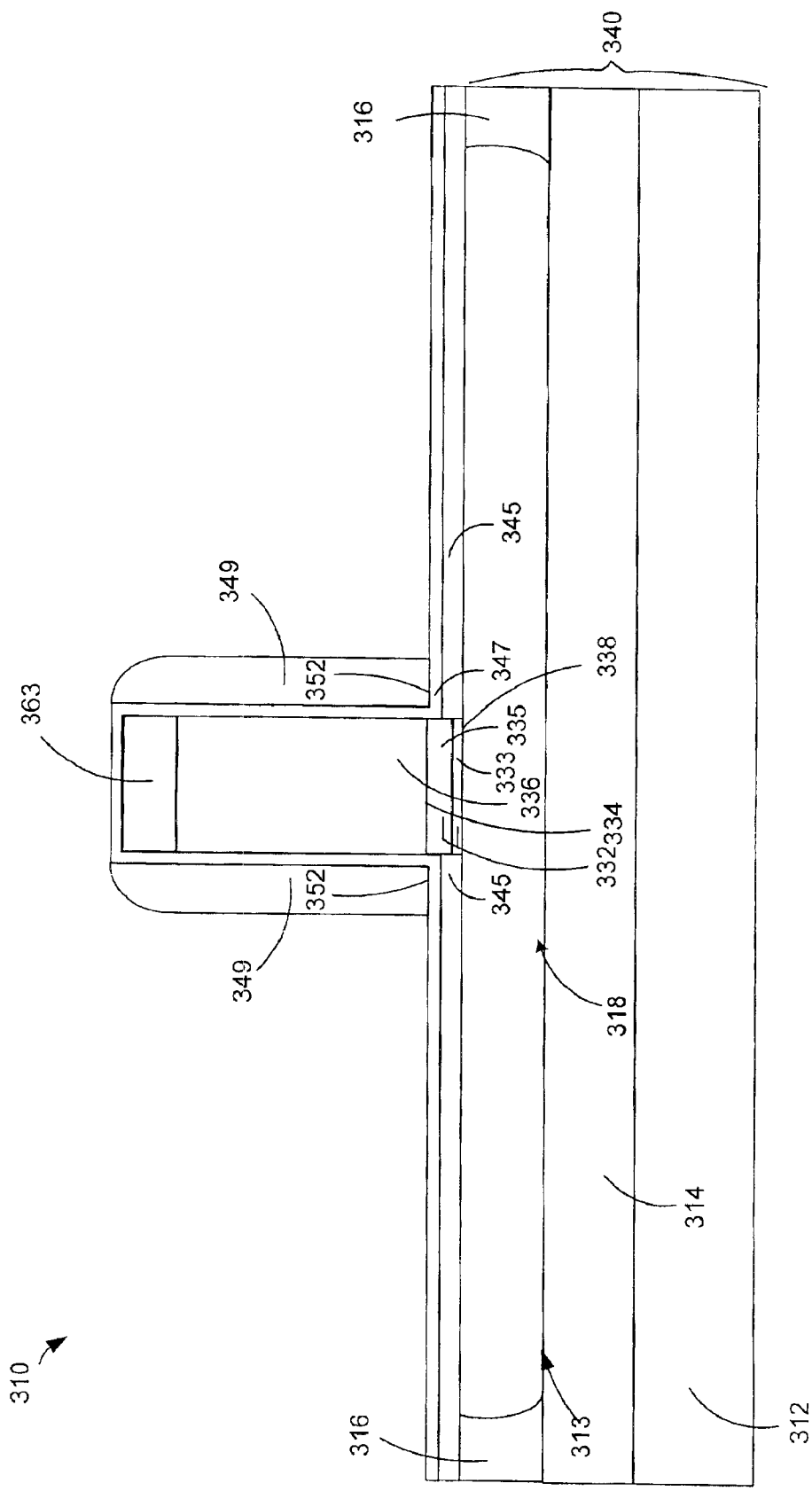

Then, in step 222 semiconductive spacers 349 are formed as shown in FIG. 3F to extend upward from the upper surface 352 of the nitride layer 347 and cover the sidewalls of the nitride layer 347 formed on the sidewalls of gate electrode 336. The semiconductive spacers 349 are formed straddling the gate electrode 336 and are used in the formation of the straddled gate, which will be further described below. In order to form the semiconductive spacers 349, a semiconductive material (not shown), e.g. polysilicon, or the like, is deposited on the nitride layer 347. The deposition produces a polysilicon layer (not shown) upon a top surface 352 of the nitride layer 347.

The polysilicon is etched with a suitable etch process, e.g. anisotropically. The polysilicon layer is reduced in size, leaving semiconductive spacers 349 of polysilicon as shown in FIG. 3F. The semiconductive spacers 349 may extend from a surface 352 of the nitride layer 347 to a height of between 800 Å and 1000 Å to be consistent with the height of the nitride topped gate. The polysilicon deposition may be performed, for example, by plasma enhanced chemical vapor deposition (PECVD) or sputtering techniques. The semiconductive spacers 349 may be implanted during source/drain implantation described below in a later step.

Figure 3G:
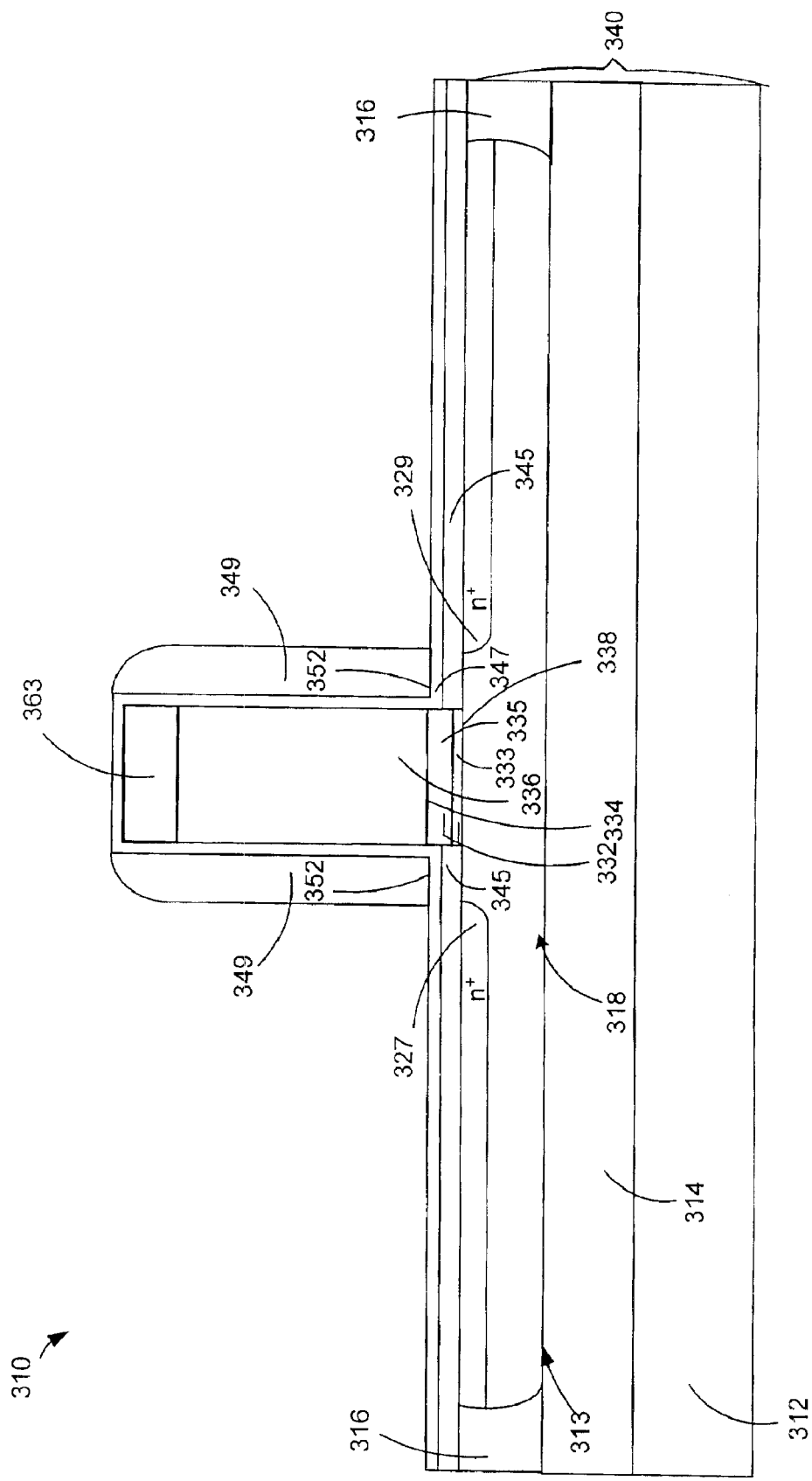

In step 224, the lightly doped source and drain regions 327 and 329 may be formed as shown in FIG. 3G using techniques well known in the art. The lightly doped source and drain regions 327 and 329 will form extension regions in a process further described below. One such technique is an extension perpendicular implant. An extension perpendicular implant is a relatively low energy, low concentration implant which is capable of producing the lightly doped source and drain regions 327 and 329. The total concentration of the extension implants may be, for example, between $1 \times 10^{18}$ atoms/cm$^3$ and $1 \times 10^{20}$ atoms/cm$^3$. An exemplary range of implant dose for the perpendicular implant is between $5 \times 10^{13}$ and $1 \times 10^{15}$ atoms/cm$^2$. The extension perpendicular implants may be of the same material as the main perpendicular implant, or may alternatively include different materials.

Figure 3H:
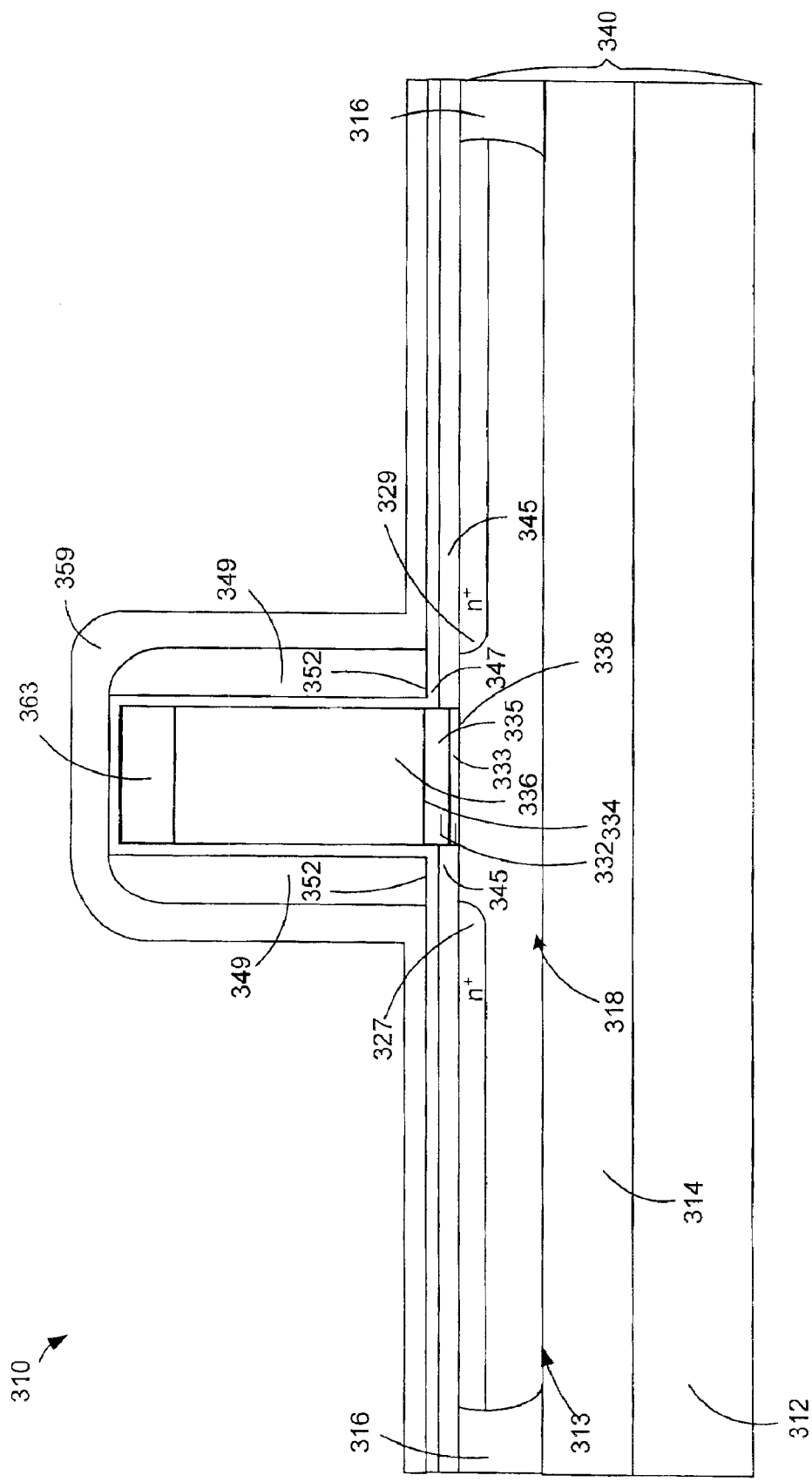

Next, in step 226 a liner oxide layer 359 is formed over the structure as represented in FIG. 3H. The liner oxide layer 359 covers the exposed sidewalls of the semiconductive spacers 349 and the exposed surface of the nitride layer 347. The liner oxide layer 359 may be made of typical, well-known oxide materials, for example SiO$_2$. The liner oxide layer 359 will act as a mask and prevent a metal layer used in a silicide formation described below from reacting with the sidewalls of the semiconductive spacers 349. An exemplary liner oxide layer 359 may have a thickness of about 30 Å.

Figure 3I:
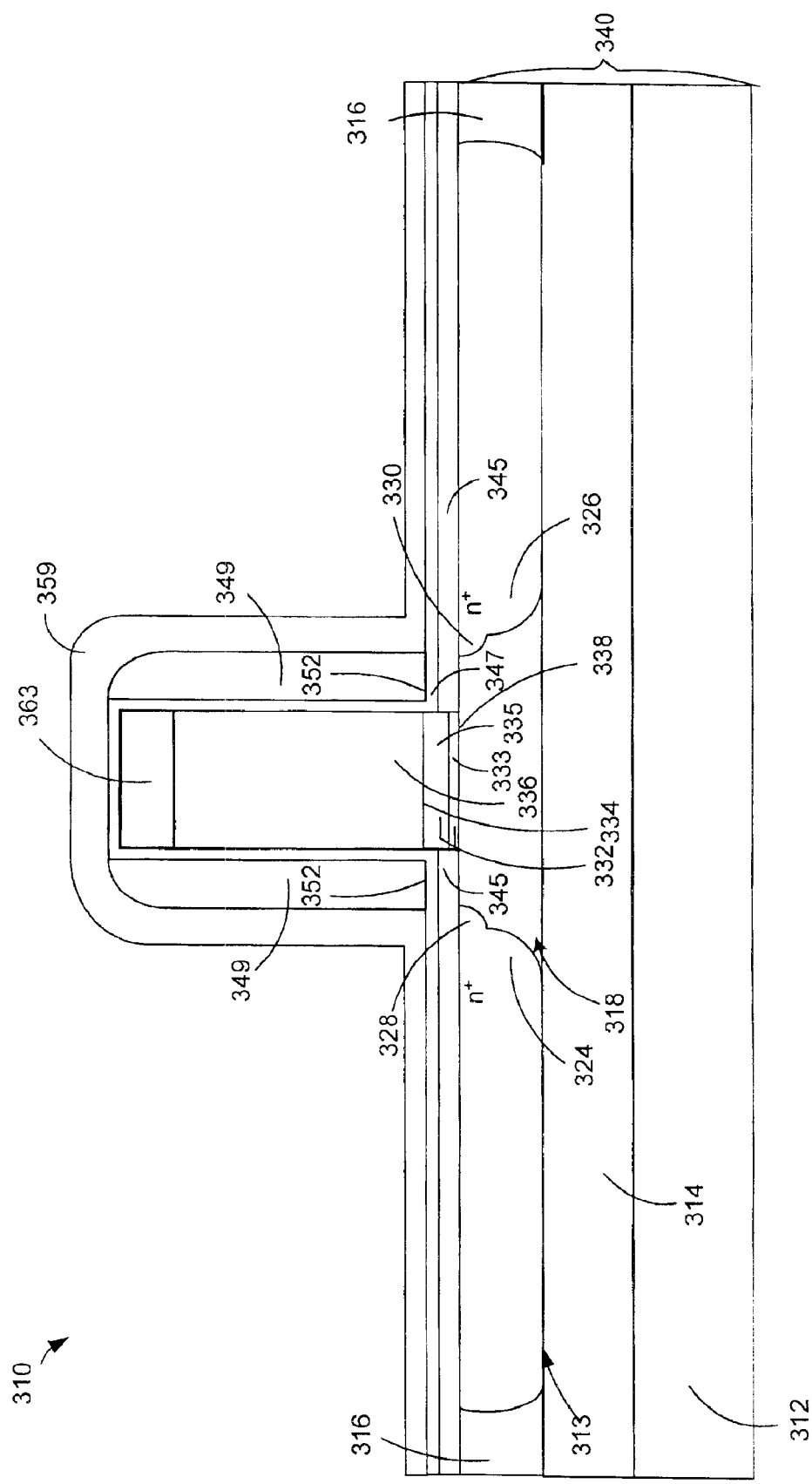

After formation of the lightly doped source and drain regions 327 and 329 in step 228, the main source and drain regions 324, 326 are formed as shown in FIG. 3I. The main source and drain regions 324, 326 may be formed by a main perpendicular implant, which will not affect the extension implant regions due to the liner oxide layer 359 acting as a mask. The main perpendicular implant is a relatively high energy, high concentration implant which is capable of producing the source and drain deep implant regions 324, 326. An exemplary range of concentration of these dopants is between $1 \times 10^{20}$ and $5 \times 10^{20}$ atoms/cm$^3$. An exemplary range of implant dose for the perpendicular implant is between $1 \times 10^{15}$ and $5 \times 10^{15}$ atoms/cm$^2$. It will be appreciated that many alternative sequences or steps may be used to accomplish the implantation. It will be appreciated that a greater number of implants may be employed. Thus, extension regions 328, 330 and main source and drain regions 324, 326 are formed.

After implantation, the semiconductor device 310 may be subjected to rapid thermal annealing (RTA) at this time or at a later time. Exemplary RTA may be performed for between five and fifteen seconds at a temperature of 1,000–1,050° C.

Figure 3J:
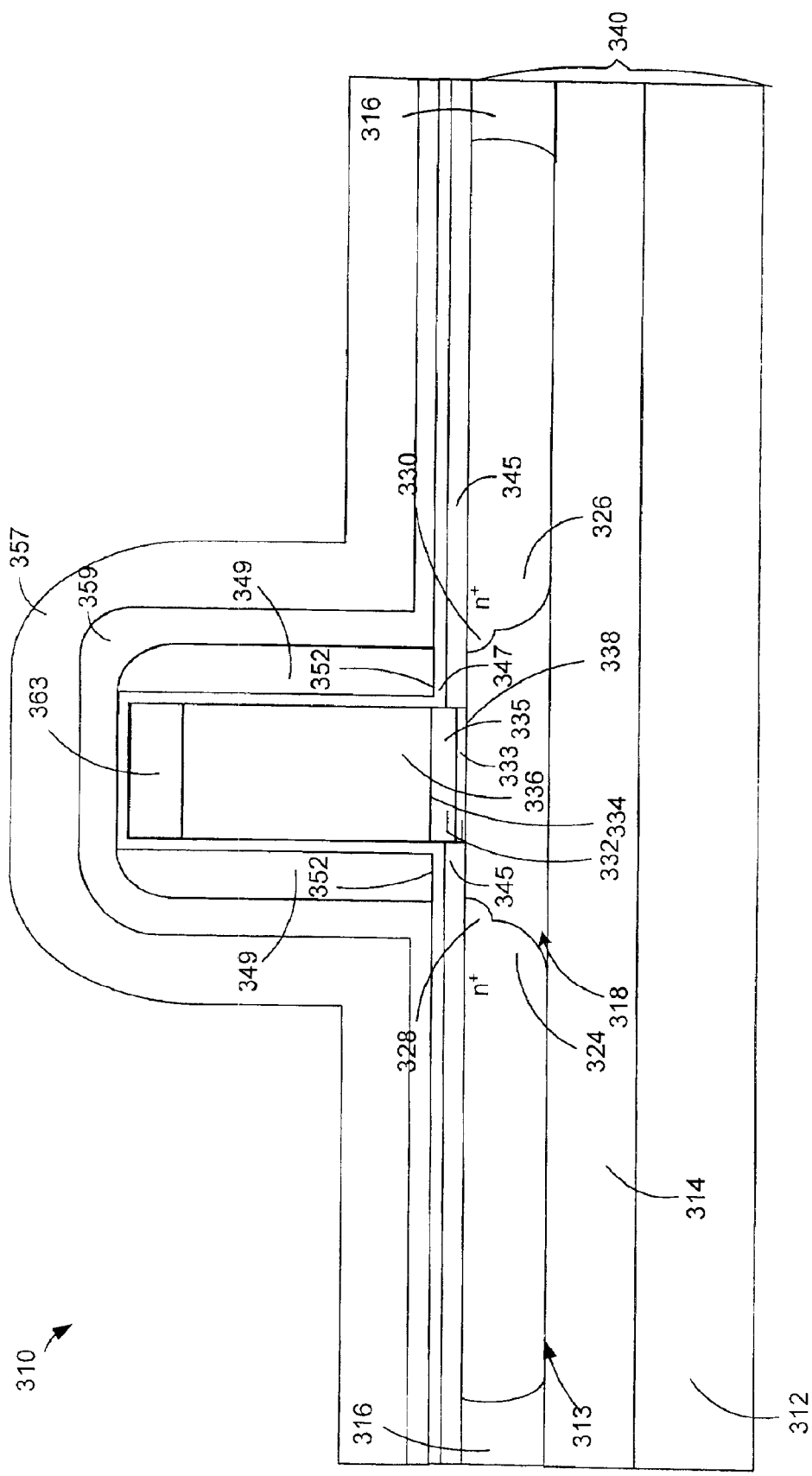

Next in step 230, a nitride layer 357 is formed over the structure as represented in FIG. 3J. The nitride layer 357 covers the exposed surface of the liner oxide layer 359. The nitride layer 357 may be made of typical, well-known nitride materials, e.g. silicon nitride (Si$_3$N$_4$), silicon oxynitride (SiON), or the like. An exemplary nitride layer 357 may have a thickness of about 30 Å.

Next in step 232, an anisotropic RIE etch is performed with a suitable etchant to remove portions of the nitride layer 357, the liner oxide layer 359, the semiconductive spacers 349, the nitride layer 347 and the oxide layer 345. Additionally, the etchant removes the nitride layer 357, the liner oxide layer 359, the nitride layer 347 and the oxide layer 345 over the deep implant regions 324, 326 down to the surface 338 of the semiconductive layer 313. The etchant also removes a portion of the nitride layer 347 over the nitride topped gate exposing the top surface of nitride layer 363. The resulting structure as shown in FIG. 3K includes nitride spacers 357a, liner oxide layers 359a, the nitride layers 347a, semiconductive spacers 350 and the oxide layer 346. The nitride spacers 357a extend from a surface 362 of the oxide layers 359a to a height of between 700 Å and 900 Å just above the height of gate electrode 336. It will be appreciated that other suitable selective etching methods well-known in the art may be used.

Figure 3L:
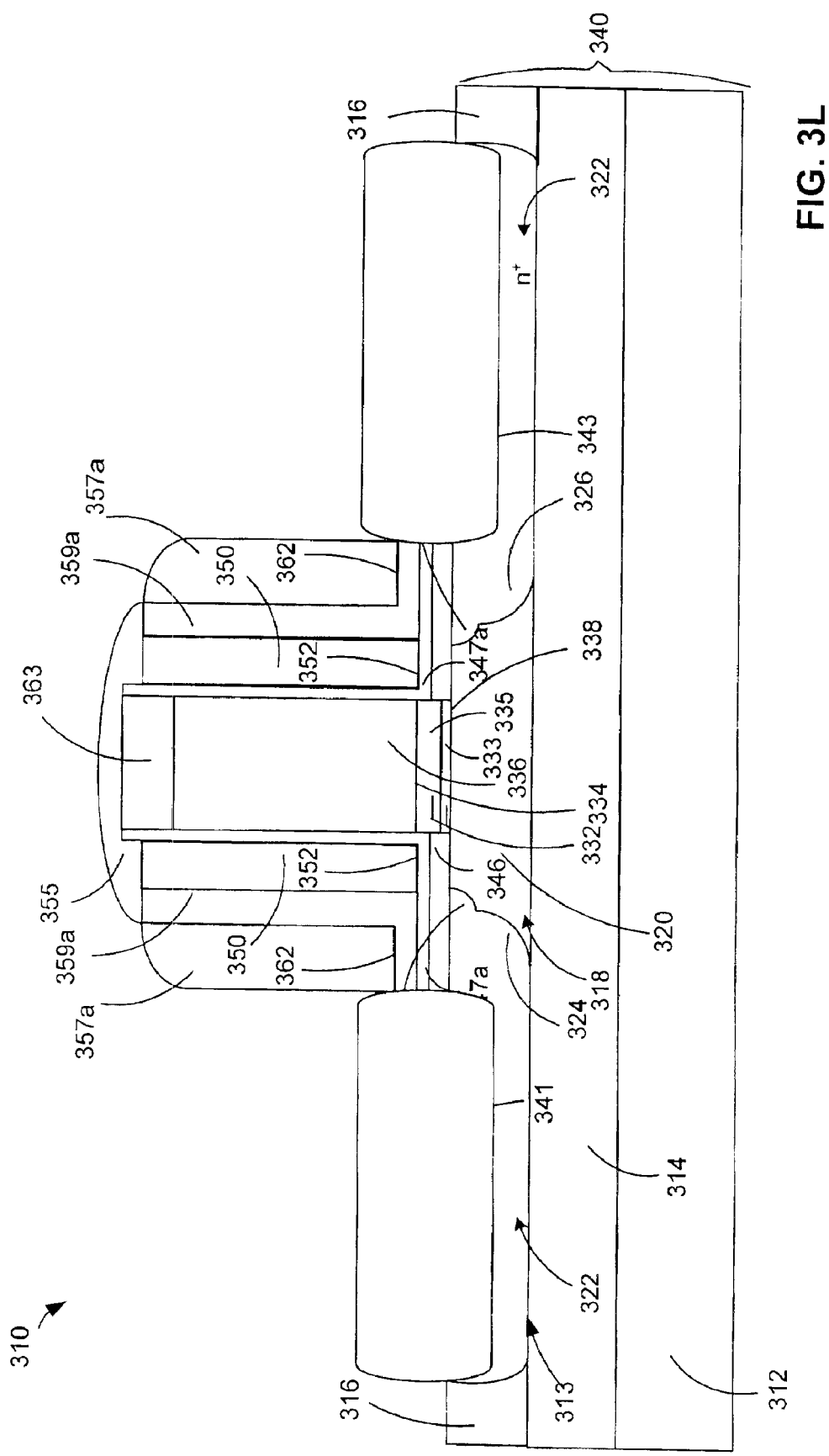

Thereafter, in step 234, silicon and polysilicon layers 341 and 343, respectively, are thermally grown on the exposed surface 338 and the semiconductive spacers 350 as shown in FIG. 3L. The silicon and polysilicon layers 341 and 343 reach a height of between 200 Å and 400 Å. Thereafter, a metal layer is formed overlying the structure (not shown). The metal layer is formed by one of either sputtering, chemical vapor deposition (CVD), or evaporation. The metal layer may comprise any metal such as platinum, titanium, tantalum, nickel, cobalt, tungsten, and/or the like. In an exemplary embodiment, cobalt is used to form the metal layer. (Cobalt is preferred due to the fact that cobalt silicides have dopant diffusion and segregation coefficients that allow for formation of shallow conformal source and drain junctions, as illustrated in FIG. 1 as an alternative to the implantation method described above.)

After deposition of the metal layer in step 236, a heating cycle is performed. The heating cycle is used to react the portions of metal layer which overlie the exposed surfaces of silicon and polysilicon layers 341 and 343. The resulting structure as illustrated in FIG. 3L remains.

If the metal layer comprises cobalt and the semiconductor layer 313 is silicon, then the cobalt reacts with the silicon within interface regions to form cobalt silicide (CoSi$_2$) including the source extension 328 and the drain extension 330 regions. Typical heat cycle temperatures for silicide/salicide formation range from 300° C. to 800° C. depending on the type of metal used. In all cases, silicided layers 342, 344, (also referred to as salicided regions in self-aligned cases) are formed within the source and drain regions 322 and the semiconductive spacers 350 via the heating cycle.

Figure 3M:
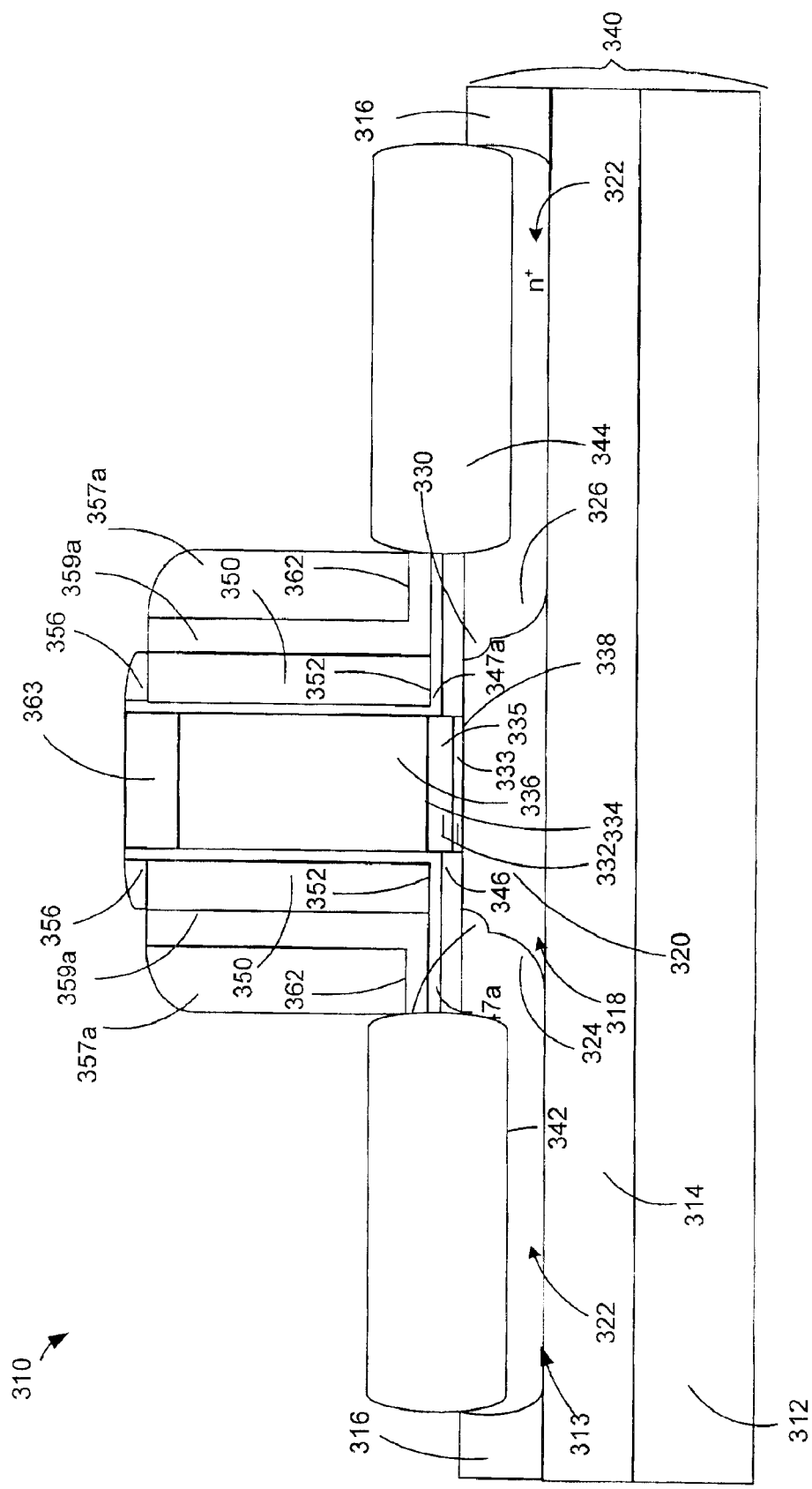

Next as shown in FIG. 3M, all unreacted portions of the metal layer are removed via known etch techniques without removing the silicided layers 342, 344 and 356. For example, cobalt may be etched using an HCl and water isotropic etch solution.

It should be understood that metal layer deposited on the polysilicon layer formed over the gate may be of the same or a different metal than the metal layer deposited over the silicon layers 341, 343 and processed as described above in a self-aligning process to produce a salicide layer 356 (shown in FIG. 3M).

In an alternative exemplary embodiment, the source and drain regions 322 can be formed using the process described below. An ion implant as described above may be used to dope the silicide regions 342, 344 with dopant atoms. Either boron, arsenic, or phosphorus may be used alone or in any combination as the dopant atoms. Therefore, either an n-type channel transistor or a p-type channel transistor may be formed. In one embodiment, the dopant atoms are ion implanted at an energy which places the dopant atoms only in the silicided regions 342, 344. Another heating cycle is used to drive the dopant atoms from the silicided regions 342, 344 into the substrate 313 to form the source and drain regions 322. In another embodiment, the ion implant of the dopant atoms may be performed at a high energy to ensure that the dopant atoms penetrate the silicided regions 342, 344 and form the source and the drain regions 322. It is important to note that the ion implantation of the silicided regions 342, 344 to form the source and the drain regions 322 may be performed at any point in time in the process shown in FIGS. 3M–3O. A self-aligned process is preferred but is optional.

Figure 3N:
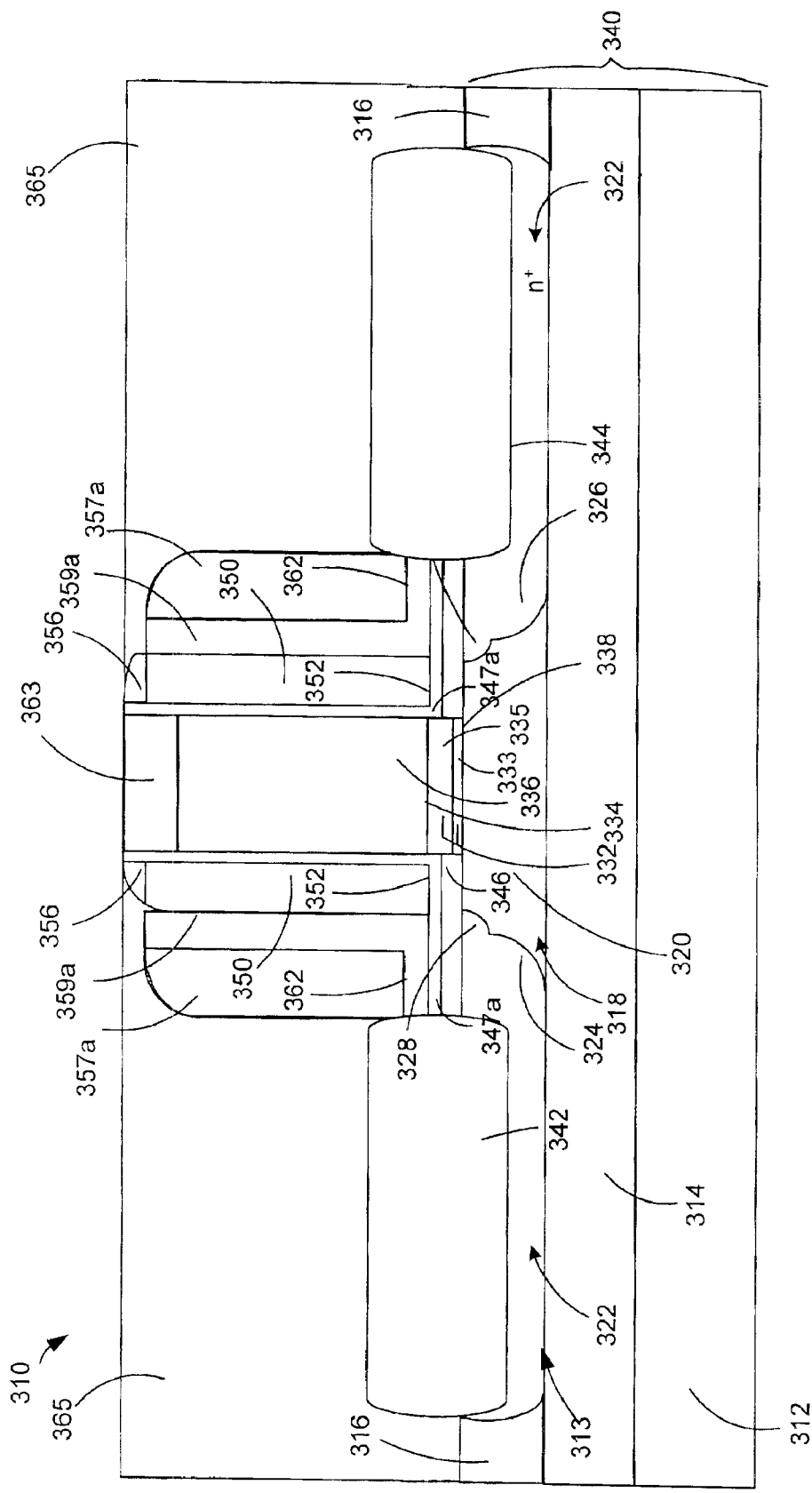
Figure 30:
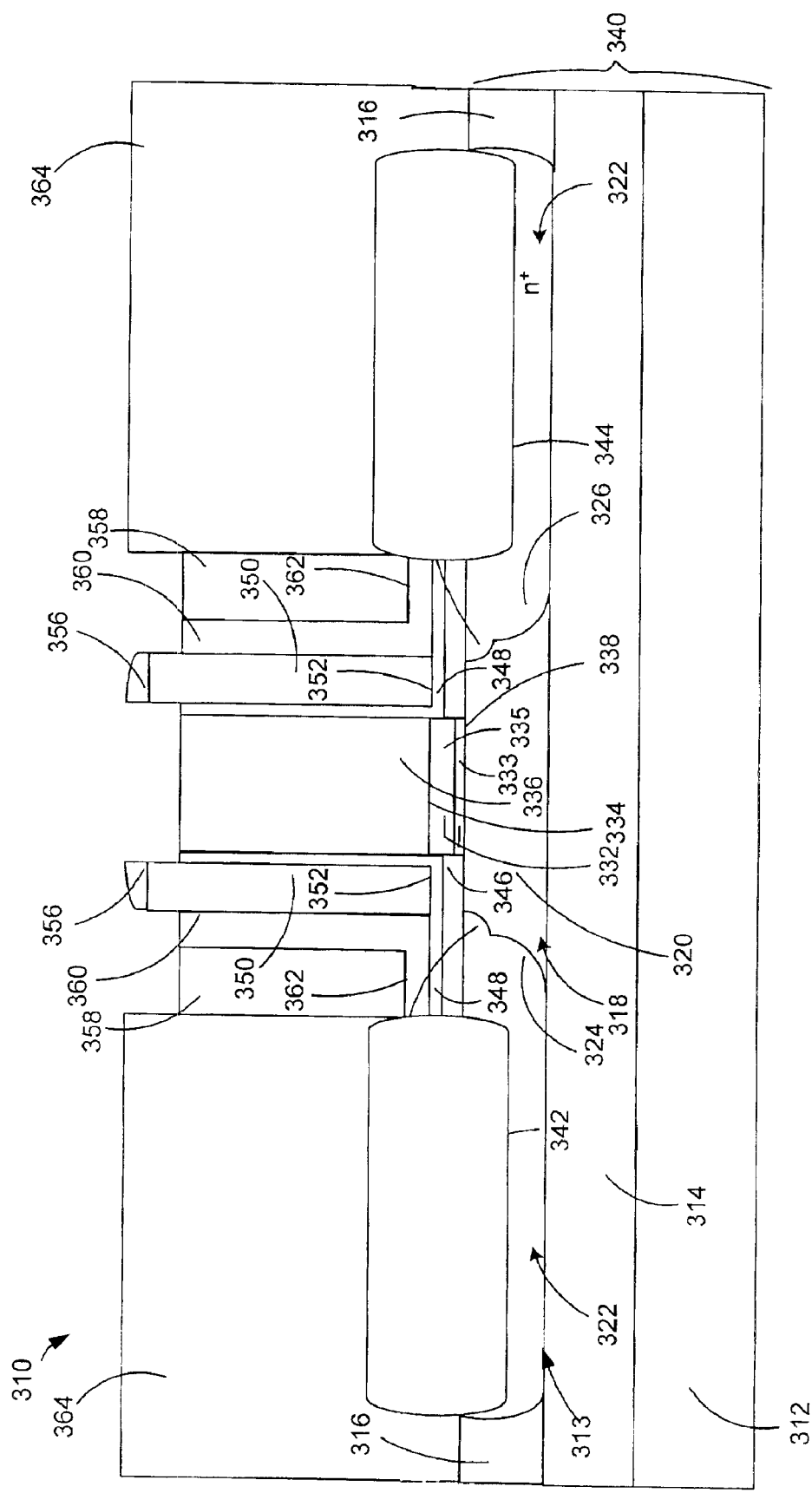

Now referring to FIG. 3N, an isolation layer, e.g. TEOS, is deposited on the intermediate structure including the nitride layer 363 on top of gate electrode 336 in step 238. The layer of TEOS reaches between 500 Å and 1000 Å above the nitride layer 363 of the nitride topped gate. Next, the TEOS is polished back to the top surface of the nitride layer 363 of the nitride topped gate. The result of this step is TEOS layer 365 that is illustrated on opposite sides of the gate device 310, respectively. TEOS layer 365 has overhangs with lower surfaces which are formed through contact with the nitride spacers 357a, the silicide caps 356 and the liner oxide layers 359a. The polishing is done using conventional techniques, which are well-known in the art.

In step 240 as illustrated in FIG. 3O, a selective etch of hot phosphoric acid is performed down to the gate electrode 336. The etchant removes a portion of the silicide caps 356, but leaves the semiconductive spacers 350 substantially unetched. All of the nitride layer 363 is removed. However, only portions of the oxide layer 359a, the nitride spacers 357a and the nitride layer 347 are removed. Thus, an upper surface of the polysilicon gate electrode 336 and a portion of the silicide capped semiconductive spacers 350 are left exposed. Thus, oxide layer 360, nitride spacers 358 and nitride layers 348 are formed. It will be appreciated that other suitable selective etching methods well-known in the art may be used.

Next, in step 242, and as illustrated in FIG. 1, contact plugs 80, 82 are formed. The contact plugs 80 are formed by masking the TEOS layer 365 to define the position of the contact plugs 80 and etching recesses in the TEOS layer 365 down to at least a top surface of the silicide layers 342, 344 above the source 322 and, if desired, the drain 322. Thus, TEOS layer 364 is formed. Then, a diffusion layer, e.g. titanium nitride (TiN), is deposited over the structure and polished back (not shown) resulting in diffusion barriers 386 as shown in FIG. 3P. The diffusion barriers 386 cover the exposed surfaces of the openings formed in the TEOS layer 365 with a barrier layer about 50 Å and 150 Å thick.

Next, the remaining recesses are filled with the material selected for the contact plugs 80, 82. It will further be appreciated that the contact plugs 80, 82 may be formed at an earlier step in the method, rather than being formed as the last step in manufacturing the straddled gate FDSOI device 310. For example, the contact plugs 80, 82 may be formed any time after the TEOS layer 364 has been formed on the FDSOI structure 340. For example, after the TEOS layer 365 is deposited and polished back in step 238 to expose the nitride topped gate. Additional openings may be made in the TEOS layers 364 to allow electrical connection to be made with the source and drain regions, and with the gate electrode. Conventional well-known methods may be utilized to make openings therethrough, as described above.

The straddle gate FDSOI device of the present invention improves the off state ($I_{off}$) while maintaining a high on state (Ion). The first gate has a work function defined that is 0.3–0.5 eV greater than the work function of the second gate. The contact connects the first gate with the second gate (straddle gate) such that when the device is in the off state ($I_{on}$) a first channel region defined by the first gate and second channel region defined by the second gate define a long channel. However, when the device is in the on state ($I_{on}$), the first channel region defines a short channel due to the greater work function of the first gate.

Although the device 10 is illustrated as a straddled gate on an FDSOI structure, other devices such as electrically erasable programmable read only memories (EEPROMs), electrically programmable read only memories (EPROMs), flash EPROMs, thyristers, diodes, thin film transistors (TFTs), and the like may be formed on FDSOI structures as described above or on other types of substrates such as germanium-on-insulator (GOI) or semiconductor-on-insulator (SOI) and benefit from the features of the above described invention.

Although particular embodiments of the invention have been described in detail, it is understood that the invention is not limited correspondingly in scope, but includes all changes, modifications and equivalents coming within the spirit and terms of the claims appended hereto.

What is claimed is:

1. A straddled gate device formed on a semiconductor-on-insulator (SOI) substrate having active regions defined by isolation regions and an insulator layer, the device comprising:

a first gate defining a first channel region interposed between a source and a drain formed within the active region of the SOI substrate;

a second gate straddling the first gate defining second channel regions interposed between the first channel region and the source and the drain;

a contact connecting the first gate with the second gate;

a first dielectric layer separating the first gate from the SOI substrate, the first dielectric layer having a relative permittivity greater than $SiO_2$; and a second dielectric layer separating the second gate from the SOI substrate, the second dielectric layer having a relative permittivity less than the first dielectric layer.

2. The straddled gate device according to claim 1, wherein the first gate defines a work function and the second gate defines a second work function, and the second work function is less than the work function of the first gate.

3. The straddled gate device according to claim 2, wherein the second work function of the second gate is 0.3–0.5 eV less than the work function of the first gate.

4. The straddled gate device according to claim 1, wherein the source and the drain include main source and drain regions and source and drain extension regions.

5. The straddled gate device according to claim 4, includes a silicide layer formed on the main source and drain regions.

6. The straddled gate device according to claim 1, includes a silicide layer formed on the source and the drain.

7. The straddled gate device according to claim 6, wherein the silicide layer which is formed on the source and the drain has a thickness in a range between 100 Å and 400 Å.

8. The straddled gate device according to claim 6, including a second silicide layer formed on electrodes of the second gate.

9. The straddled gate device according to claim 8, wherein the second silicide layer formed on the electrodes of the second gate has a thickness in a range between 100 Å and 400 Å.

10. The straddled gate device according to claim 8, wherein the silicide layer formed on the source and the drain and the second silicide layer formed on the electrodes of the second gate are of silicide of different species.

11. The straddled gate device according to claim 1, wherein when the device is in an off state ($T_{off}$), a length of an active channel is defined by the first gate and the second gate and when the device is in the on state ($I_{on}$), the length of the active channel is defined by the first gate.

12. The straddled gate device according to claim 1, further including:
 a liner interposed between the first gate and the second gate.

13. The straddled gate device according to claim 1, wherein the SOI substrate is a fully depleted SOI (FDSOI) substrate.

14. A straddled gate device formed on a semiconductor-on-insulator (SOI) substrate having active regions defined by isolation regions and an insulator layer, the device comprising:
 a first gate defining a first channel region interposed between a source and a drain formed within the active region of the SOI substrate;
 a second gate straddling the first gate defining second channel regions interposed between the first channel region and the source and the drain;
 a contact connecting the first gate with the second gate;
 a first dielectric layer separating the first gate from the SOI substrate, the first dielectric layer having a relative permittivity greater than $SiO_2$;
 a second dielectric layer separating the second gate from the SOI substrate, the second dielectric layer having a relative permittivity less than the first dielectric layer; and
 a liner interposed between the first gate and the second gate;
 wherein the liner includes a segment separating the second gate and the SOI substrate.

15. The straddled gate device according to claim 14, wherein a dielectric layer is disposed between the segment separating the second gate and the SOI substrate.

* * * * *

UNITED STATES PATENT AND TRADEMARK OFFICE
CERTIFICATE OF CORRECTION

| | | |
|---|---|---|
| PATENT NO. | : 6,888,198 B1 | Page 1 of 1 |
| APPLICATION NO. | : 09/873674 | |
| DATED | : May 3, 2005 | |
| INVENTOR(S) | : Krivokapic | |

It is certified that error appears in the above-identified patent and that said Letters Patent is hereby corrected as shown below:

Column 11, claim 11, line 2, replace "$T_{off}$" with --$I_{off}$--

Signed and Sealed this

Thirteenth Day of November, 2007

JON W. DUDAS
*Director of the United States Patent and Trademark Office*